(12) United States Patent
Osada

(10) Patent No.: US 8,729,934 B2
(45) Date of Patent: May 20, 2014

(54) ELECTRONIC CIRCUIT

(71) Applicant: Yoshihiro Osada, Osaka (JP)

(72) Inventor: Yoshihiro Osada, Osaka (JP)

(73) Assignee: Kyocera Document Solutions, Inc. (JP)

( * ) Notice: Subject to any disclaimer, the term of this patent is extended or adjusted under 35 U.S.C. 154(b) by 47 days.

(21) Appl. No.: 13/624,538

(22) Filed: Sep. 21, 2012

(65) Prior Publication Data

US 2013/0082750 A1   Apr. 4, 2013

(30) Foreign Application Priority Data

Sep. 30, 2011   (JP) .................................. 2011-216033

(51) Int. Cl.
H03K 3/02 (2006.01)
(52) U.S. Cl.
USPC ............................ 327/142; 327/198; 327/143
(58) Field of Classification Search
None
See application file for complete search history.

(56) References Cited

U.S. PATENT DOCUMENTS

| | | | | |
|---|---|---|---|---|
| 4,438,357 A * | 3/1984 | Wicnienski | .................... | 327/143 |
| 4,940,904 A * | 7/1990 | Lin | ............................... | 327/256 |
| 5,629,642 A | 5/1997 | Yoshimura | | |
| 5,739,708 A * | 4/1998 | LeWalter | ....................... | 327/143 |
| 6,608,508 B1 * | 8/2003 | Iwaguro et al. | ................ | 327/142 |
| 6,690,220 B2 * | 2/2004 | Kuboshima et al. | .......... | 327/198 |
| 7,659,752 B2 * | 2/2010 | Muraoka | ......................... | 327/34 |
| 8,258,844 B2 * | 9/2012 | Elrod et al. | .................... | 327/198 |
| 2006/0103436 A1 | 5/2006 | Saitou | | |

FOREIGN PATENT DOCUMENTS

JP   2000-269788   9/2000

* cited by examiner

Primary Examiner — Tuan T Lam

(57) ABSTRACT

An electronic circuit of the present disclosure includes a noise eliminating circuit configured to eliminate noise in a reset signal and output a signal obtained by eliminating the noise in the reset signal; a digital circuit configured to be reset by the signal outputted from the noise eliminating circuit; and an early-initialization circuit configured to fix an output signal of the digital circuit at a predetermined value until a reset status due to the reset signal is released.

6 Claims, 4 Drawing Sheets

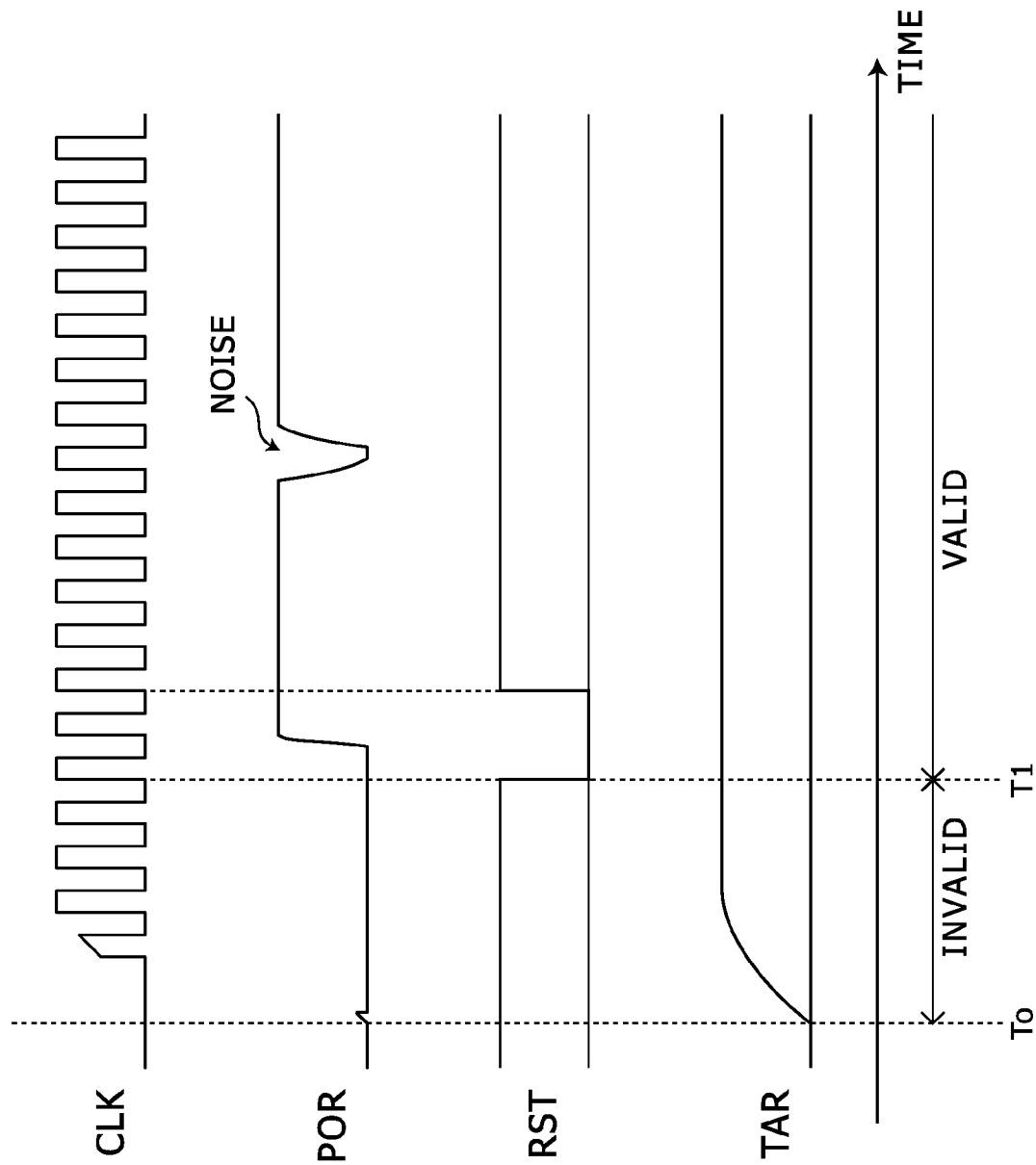

US 8,729,934 B2

ELECTRONIC CIRCUIT

CROSS-REFERENCE TO RELATED APPLICATION

This application relates to and claims priority rights from a Japanese Patent Application: No. 2011-216033, filed on Sep. 30, 2011, the entire disclosures of which are hereby incorporated by reference herein.

BACKGROUND OF THE DISCLOSURE

1. Field of the Disclosure

The present disclosure relates to electronic circuits.

2. Description of the Related Art

In general, a power-on reset is used to initialize a digital circuit in an electronic device when it is powered on. In the power-on reset, for example, when the electronic device is powered on, the electronic device is initialized by supplying a reset signal to the digital circuit with a delay from the time when it is powered on.

FIG. 3 shows a circuit diagram which indicates an example of an electronic circuit in which a digital circuit is asynchronously reset by a power-on reset. FIG. 4 shows a timing chart which indicates an example of a clock signal, a power-on reset signal, and a status of an output terminal in the electronic circuit shown in FIG. 3.

In the electronic circuit shown in FIG. 3, a clock generator circuit 2 and a power-on reset circuit 3 are connected to an IC (Integrated Circuit) chip 101. A clock signal CLK is inputted from the clock generator circuit 2 to a CLK terminal of the IC chip 101, and a power-on reset signal POR is inputted from the power-on reset circuit 3 to a POR terminal of the IC chip 101.

The IC chip 101 includes a digital circuit 111, and an output signal of the digital circuit 111 is applied to an output terminal TAR via an output buffer 112.

In a noiseful environment, if this power-on reset signal is directly used as a reset signal for an asynchronous reset, the digital circuit 111 is reset by noise in error. Therefore, a noise eliminating circuit 113 eliminates noise in the power-on reset signal.

Into the noise eliminating circuit 113, the clock signal CLK is supplied via an input buffer 114, and the power-on reset signal POR is supplied via an input buffer 115; and an output signal thereof in which noise has been eliminated (a reset signal RST) is used for an asynchronous reset of the digital circuit 111. The noise eliminating circuit 113 delays the power-on reset signal by a predetermined number of clocks, eliminates noise in the power-on reset signal by performing a logical operation between the delayed power-on reset signal and the current power-on reset signal, and outputs a signal obtained by the logical operation as the reset signal RST. Therefore, even if noise occurs in the power-on reset signal, the digital circuit 111 is not reset due to the noise.

However, in the case that the digital circuit 111 is initialized in such way, a delay period until a reset status due to the power-on reset signal is released and the reset signal RST is supplied to the digital circuit 111 (i.e. a period from the power-on timing To to the time T1 in FIG. 4) must be set longer than the delay at the noise eliminating circuit 113, and consequently, during the delay period, the value of the output signal of the digital circuit is invalid (i.e. indefinite). Therefore, during this period, a circuit or device connected to the output terminal TAR may malfunction.

For instance, in the case that a control signal for a motor is outputted from the output terminal TAR, upon a power-on, during the period when the value of the output signal of the digital circuit 111 is invalid (i.e. indefinite), the control signal may take an unexpected value and the motor runs unexpectedly.

SUMMARY OF THE DISCLOSURE

An electronic circuit according to an aspect of the present disclosure includes a noise eliminating circuit configured to eliminate noise in a reset signal and output a signal obtained by eliminating the noise in the reset signal; a digital circuit configured to be reset by the signal outputted from the noise eliminating circuit; and an early-initialization circuit configured to fix an output signal of the digital circuit at a predetermined value until a reset status due to the reset signal is released.

Therefore, the output signal of the digital circuit does not take an invalid value during a period until a reset status, for example, due to a power-on reset signal is released, and consequently, it reduces malfunction due to the reset during an initialization of the digital circuit.

These and other objects, features and advantages of the present disclosure will become more apparent upon reading of the following detailed description along with the accompanied drawings.

BRIEF DESCRIPTION OF THE DRAWINGS

FIG. 4 shows a timing chart which indicates an example of a clock signal, a power-on reset signal, and a status of an output terminal in the electronic circuit shown in FIG. 3.

DETAILED DESCRIPTION

Hereinafter, an embodiment according to aspects of the present disclosure will be explained with reference to drawings.

Figure 1:
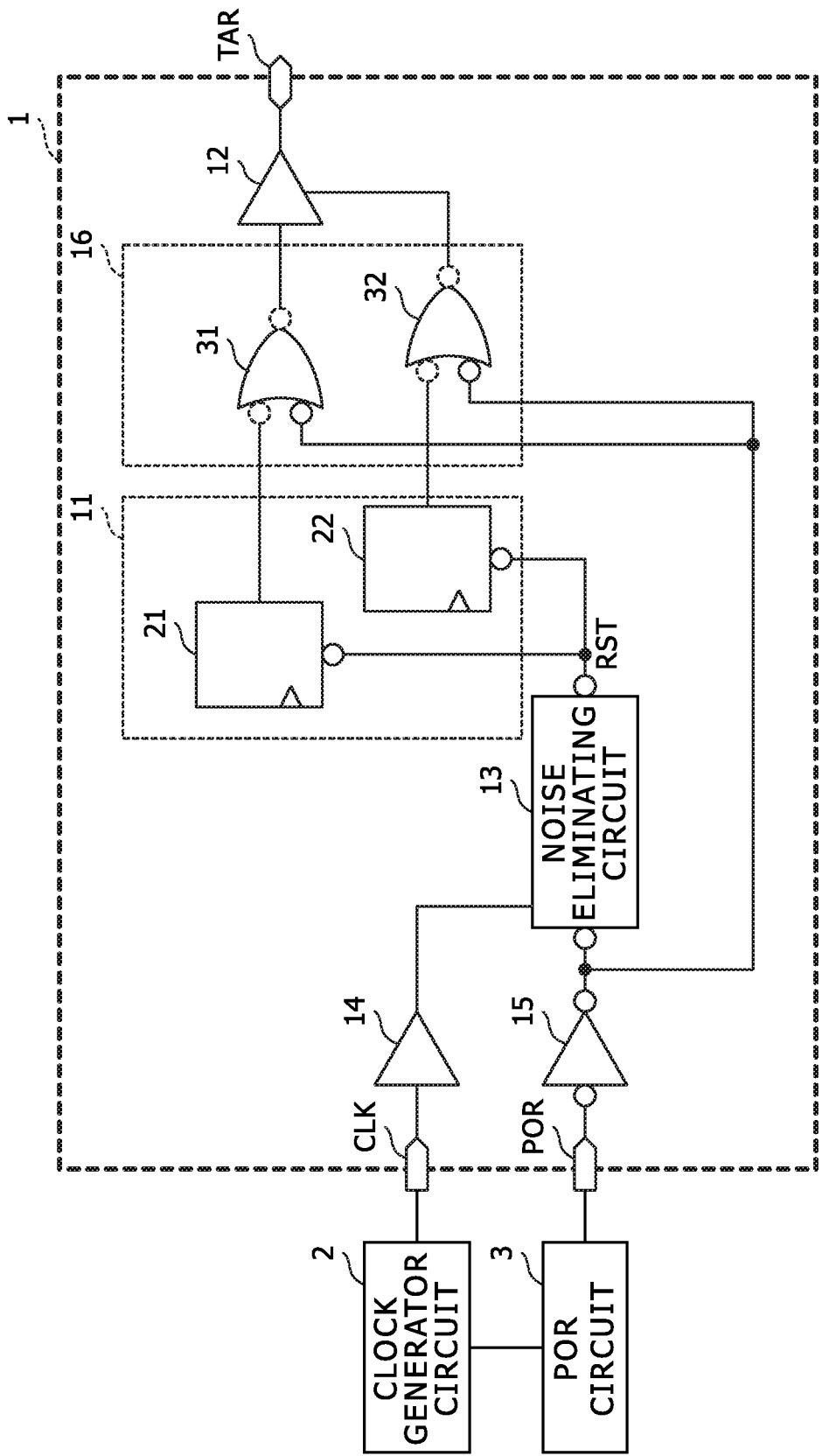
FIG. 1 shows a circuit diagram which indicates a configuration of an electronic circuit according to an embodiment of the present disclosure.

FIG. 1 shows a circuit diagram which indicates a configuration of an electronic circuit according to an embodiment of the present disclosure.

In the electronic circuit shown in FIG. 1, a clock generator circuit 2 and a power-on reset circuit 3 are connected to an IC chip 1. A clock signal CLK is inputted from the clock generator circuit 2 to a CLK terminal of the IC chip 1, and a power-on reset signal POR is inputted from the power-on reset circuit 3 to a POR terminal of the IC chip 1. An output terminal TAR of the IC chip 1 is connected to an unshown circuit or device.

The IC chip 1 includes a digital circuit 11, an output buffer 12, a noise eliminating circuit 13, input buffers 14 and 15, and an early-initialization circuit 16.

The digital circuit 11 is a sequential logic circuit which includes flip-flops 21 and 22. It should be noted that the digital circuit 11 may include elements other than the flip-flops 21 and 22, but they are not shown in FIG. 1.

Into the noise eliminating circuit 13, the clock signal CLK is supplied via an input buffer 14, and the power-on reset signal POR is supplied via an input buffer 15; and an output signal thereof in which noise has been eliminated (a reset signal RST) is used for an asynchronous reset of the digital circuit 11. The noise eliminating circuit 13 delays the power-on reset signal by a predetermined number of clocks, eliminates noise in the power-on reset signal by performing a logical operation between the delayed power-on reset signal and the current power-on reset signal, and outputs a signal obtained by the logical operation as the reset signal RST to the digital circuit 11. Therefore, a period in which a reset status remains due to the power-on reset signal is set longer than the delay at the noise eliminating circuit 13.

The early-initialization circuit 16 is put between the digital circuit 11 and the output buffer 12 connected to the output terminal TAR, fixes an output signal of the digital circuit 11 at a predetermined value until a reset status due to the power-on reset signal is released, and directly supplies an output signal of the digital circuit 11 to the output buffer 12 after the reset status due to the power-on reset signal is released.

In this embodiment, the digital circuit 11 outputs two output signals from the flip-flops 21 and 22. The early-initialization circuit 16 includes two OR operation circuits and 32, performs logical operations between the respective output signals of the digital circuit 11 and the power-on reset signal, and outputs results of the logical operations.

In this embodiment, the value of the power-on reset signal changes to the H (high) level after the reset status is released, and this power-on reset signal is inverted and inputted as respective ones of input signals to the OR operation circuits 31 and 32. In correspondence with fixed values to be outputted from the circuits 31 and 32 the during the period until the reset status due to the power-on reset signal is released, both of the other input and the output of the OR operation circuit 31 are set as either inverse ones or non-inverse ones, and both of the other input and the output of the OR operation circuit 32 are set as either inverse ones or non-inverse ones.

In the early-initialization circuit 16, AND operation circuits may be used instead of the OR operation circuits 31 and 32. If the AND operation circuits are used, two inputs and one output of the AND operation circuits are properly set as either inverse ones or non-inverse ones.

The output buffer 12 is a tristate buffer. Into the output buffer 12, an input signal is supplied from the OR operation circuit 31, and a control signal is supplied from the OR operation circuit 32.

In the following part, a behavior of the aforementioned electronic circuit is explained.

Figure 2:
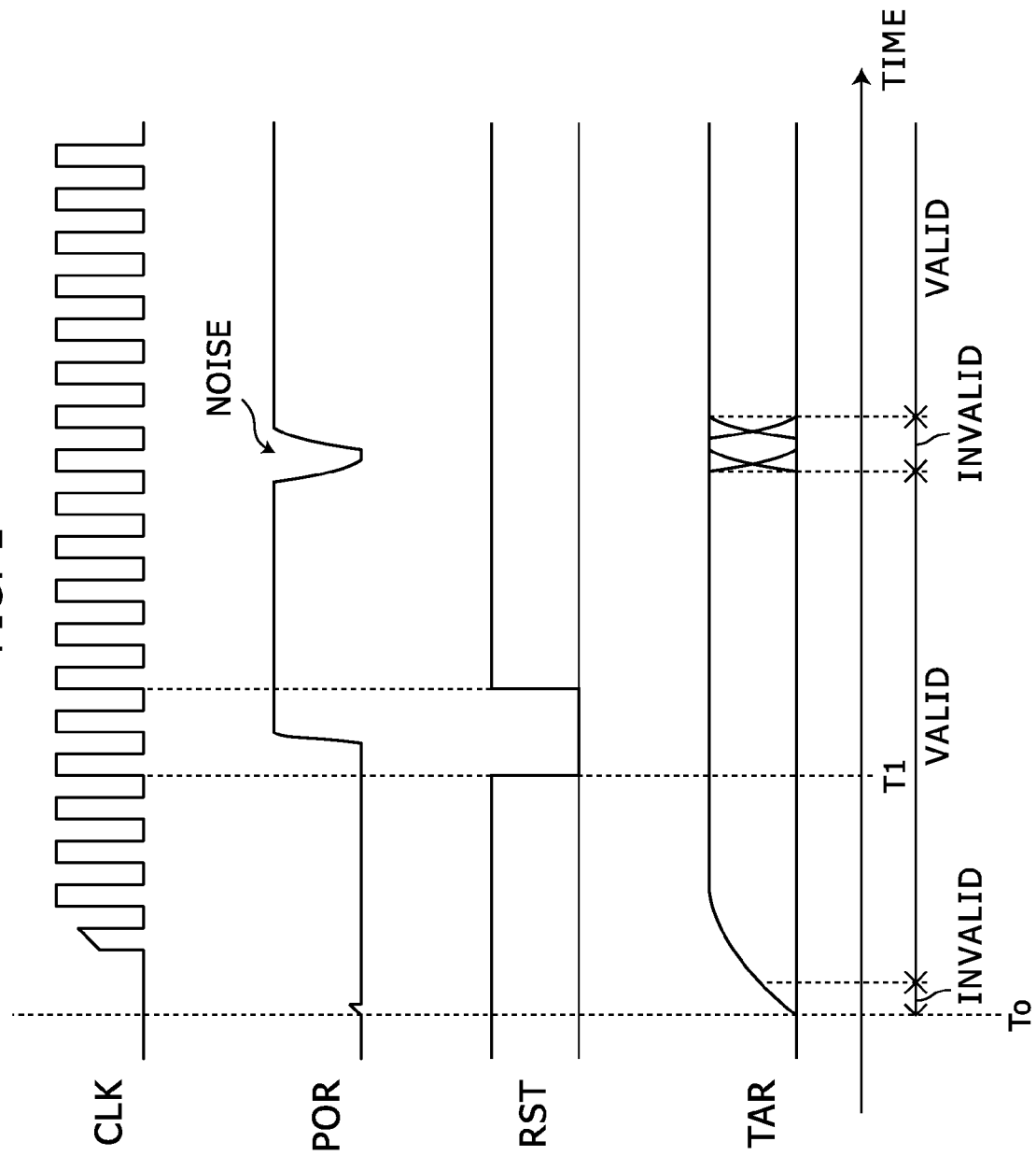
FIG. 2 shows a timing chart which indicates an example of a clock signal, a power-on reset signal, and a status of an output terminal in the electronic circuit shown in FIG. 1.
Figure 3:
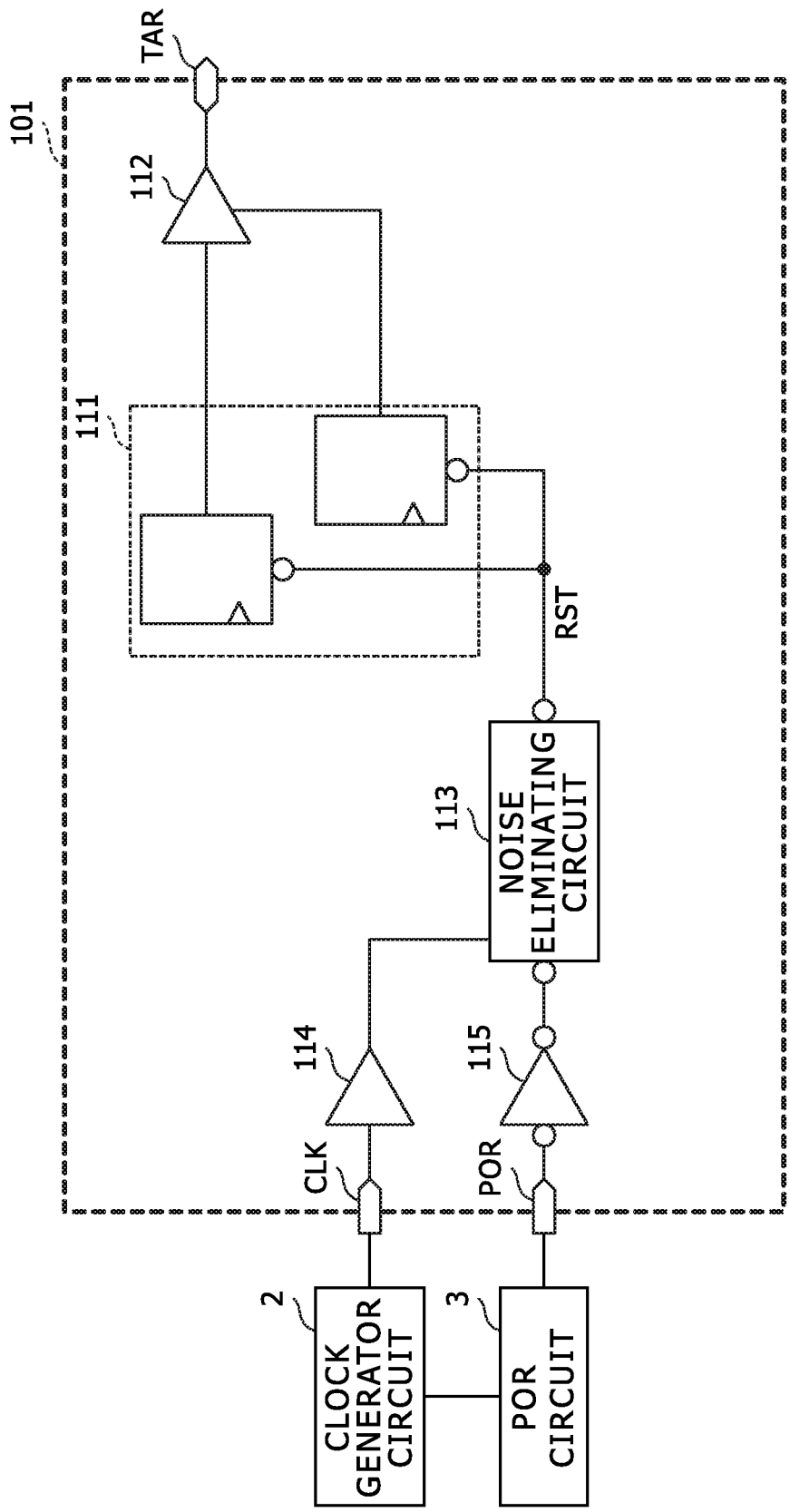
FIG. 3 shows a circuit diagram which indicates an example of an electronic circuit in which a digital circuit is asynchronously reset by a power-on reset.

FIG. 2 shows a timing chart which indicates an example of a clock signal, a power-on reset signal, and a status of an output terminal in the electronic circuit shown in FIG. 1.

When an electronic device which includes the present electronic circuit is powered-on (at the time To), each part starts operating in the electronic circuit.

As shown in FIG. 2, the clock generator circuit 2 starts outputting the clock signal CLK with a delay from the power-on (the time To).

In addition, with a delay from the power-on (the time To), the power-on reset circuit 3 releases a reset status set by a power-on reset signal POR. In this embodiment, the reset status is released by changing the power-on reset signal POR from the L (low) level to the H (high) level.

The clock signal CLK and the power-on reset signal POR are supplied to the noise eliminating circuit 13 of the IC chip 1. The noise eliminating circuit 13 delays the power-on reset signal by a predetermined number of clocks in the clock signal CLK, and supplies a reset signal RST (here, an L-level pulse signal) when both of the current power-on reset signal and the delayed power-on reset signal take the L level.

Before the reset signal RST is supplied (i.e. in the period from the time To to the time T1), the value of the output signal of the digital circuit 11 is invalid (indefinite). When the reset signal RST is supplied (at the time T1), the digital circuit 11 is initialized, and afterward, the value of the output signal of the digital circuit 11 is valid.

On the other hand, since the power-on reset signal takes the L level during the period from the time To to the time T1 (i.e. the period when the output of the digital circuit 11 is indefinite), the fixed values outputted from the early-initialization circuit 16 are supplied to the output buffer 12, and a signal with the level specified by the early-initialization circuit 16 is supplied from the output buffer 12 to the output terminal TAR. Therefore, the level of the output terminal TAR is valid during the period from the time To to the time T1. However, in a short time immediately after the power-on, the power supply still takes a low voltage, and therefore, does not ensure that the input buffer 15, the early-initialization circuit 16, and the output buffer 12 operate properly, and consequently, the level of the output terminal TAR is not valid.

During the period after the time T1, the power-on reset signal takes the H level, and therefore, the early-initialization circuit 16 directly supplies the output signal of the digital circuit 11 to the output buffer 12, and consequently, a signal with the level specified by the digital circuit 11 is applied to the output terminal TAR. During this period, the level of the output terminal TAR is also valid.

As shown in FIG. 2, in the period after the time T1, if noise occurs in the power-on reset signal, the fixed values outputted from the early-initialization circuit 16 are supplied to the output buffer 12 due to the noise. In this time, it is not ensured that the fixed values are identical to proper values of the output signals of the digital circuit 11, and therefore, the level of the output terminal TAR is not valid in the period when the noise occurs in the power-on reset signal. However, since this noise is eliminated by the noise eliminating circuit 13, the noise does not result in supplying the reset signal RST to the digital circuit 11, and the digital circuit 11 continues to operate properly. Since the digital circuit 11 continues to operate properly, the level of the output terminal TAR returns to be valid immediately after the noise in the power-on reset signal disappears.

In the aforementioned embodiment, the noise eliminating circuit 13 eliminates noise in the power-on reset signal and outputs a signal obtained by eliminating noise in the power-on reset signal; the digital circuit 11 is reset by the signal outputted from the noise eliminating circuit 13; and the early-initialization circuit 16 fixes an output signal of the digital circuit 11 at a predetermined value until a reset status due to the power-on reset signal is released.

Therefore, the output signal of the digital circuit 11 does not take an invalid value during a period until the reset status due to the power-on reset signal is released, and consequently, it reduces malfunction due to the reset during an initialization of the digital circuit 11.

The description of the present disclosure has been presented for purposes of illustration and description, and is not intended to be exhaustive or limited to the disclosure in the form disclosed.

For example, in the aforementioned embodiment, a forced reset signal generated in correspondence with a user's reset operation or the like may be used instead of the power-on reset signal. If the forced reset signal is used, a forced reset circuit which generates the forced reset signal is used instead of the power-on reset circuit 3.

Further, in the aforementioned embodiment, the signal inputted to the output buffer 12 connected to the output terminal TAR is made valid in an early time. In the same manner, a control signal inputted to an input buffer (e.g. tristate buffer) connected to the input terminal may be made valid in an early time. Furthermore, in the same manner, a signal inputted to an input/output buffer connected to the output terminal TAR may be made valid in an early time.

It should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

What is claimed is:

1. An electronic circuit, comprising:
a noise eliminating circuit configured to eliminate noise in a reset signal and output a signal obtained by eliminating the noise in the reset signal;
a digital circuit configured to be reset by the signal outputted from the noise eliminating circuit; and
an early-initialization circuit configured to fix an output signal of the digital circuit at a predetermined value until a reset status due to the reset signal is released.

2. The electronic circuit according to claim 1, wherein:
the reset signal is a power-on reset signal.

3. The electronic circuit according to claim 1, wherein:
the early-initialization circuit is further configured to perform a logical operation between the output signal of the digital circuit and the reset signal, and output a result of the logical operation.

4. The electronic circuit according to claim 1, wherein:
the digital circuit is a sequential logic circuit, and
the noise eliminating circuit is further configured to asynchronously reset the sequential logic circuit according to the signal obtained by eliminating the noise in the reset signal.

5. The electronic circuit according to claim 1, wherein:
the noise eliminating circuit is further configured to delay the reset signal by a predetermined number of clocks, eliminate noise in the reset signal by performing a logical operation between the delayed reset signal and the current reset signal, and output a signal obtained by the logical operation as the signal obtained by eliminating the noise in the reset signal.

6. The electronic circuit according to claim 1, wherein:
an IC chip comprises the noise eliminating circuit, the digital circuit and the early-initialization circuit, and further comprises an input terminal of the reset signal, an output terminal, and an output buffer connected to the output terminal; and
the early-initialization circuit is connected to the output buffer.

* * * * *